US006418537B1

(12) United States Patent
Yang et al.

(10) Patent No.: US 6,418,537 B1
(45) Date of Patent: Jul. 9, 2002

(54) ACCURATE TIMING CALIBRATION FOR EACH OF MULTIPLE HIGH-SPEED CLOCKED RECEIVERS USING A SINGLE DLL

(75) Inventors: Kewei Yang, San Jose; Feng Cheng Lin, Union City, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/350,414

(22) Filed: Jul. 8, 1999

Related U.S. Application Data

(63) Continuation-in-part of application No. 08/986,430, filed on Dec. 7, 1997, now Pat. No. 6,065,077, and a continuation-in-part of application No. 09/163,294, filed on Sep. 29, 1998, now Pat. No. 6,292,705, and a continuation-in-part of application No. 09/281,749, filed on Mar. 30, 1999.

(51) Int. Cl.[7] .............................. G06F 1/04; G06F 3/00
(52) U.S. Cl. ...................... 713/400; 713/503; 710/60
(58) Field of Search .................... 713/400, 401, 713/503; 327/141, 155, 156, 158, 161; 375/200, 316, 354

(56) References Cited

U.S. PATENT DOCUMENTS

| | | | |
|---|---|---|---|
| 4,315,308 | A | 2/1982 | Jackson |
| 4,438,494 | A | 3/1984 | Budde et al. |
| 4,480,307 | A | 10/1984 | Budde et al. |
| 5,161,156 | A | 11/1992 | Baum et al. |
| 5,271,000 | A | 12/1993 | Engbersen et al. |
| 5,313,609 | A | 5/1994 | Baylor et al. |
| 5,335,335 | A | 8/1994 | Jackson et al. |
| 5,440,698 | A | 8/1995 | Sindhu et al. |
| 5,505,686 | A | 4/1996 | Willis et al. |
| 5,511,226 | A | 4/1996 | Zilka |
| 5,513,335 | A | 4/1996 | McClure |

(List continued on next page.)

OTHER PUBLICATIONS

Technical White Paper, Sun TM Enterprise TM 10000 Server, Sun Microsystems, Sep. 1998.
Alan Charlesworth, Starfire: Extending the SMP Envelope, IEEE Micro, Jan./Feb. 1998, pp. 39–49.
Joseph Heinrich, Origin TM and Onyz2 TM Theory of Operations Manual, Document No. 007–3439–002, Silicon Graphics, Inc., 1997.
White Paper, Sequent's NUMA–Q SMP Architecture, Sequent, 1997.

(List continued on next page.)

*Primary Examiner*—Thomas M. Heckler
(74) *Attorney, Agent, or Firm*—Keith Kind; Kelly H. Hale

(57) ABSTRACT

In a preferred embodiment, the invention uses an 8-to-1 data serialization circuit in the transmitter to convert 80-bit parallel 200 MHz data to 10-bit parallel 1.6 Mb/s date. On the receiver side, data are captured using a forwarded clock and de-serialized. A single global DLL generates 16 master phases without reference to the word boundaries of data being transmitted. These 16 unreferenced phases are input to a phase rotator that, via a series of calibration steps, maps the unreferenced phases into named phases, and in doing so references the phases to the word boundary of the data being transmitted over the slowest data line of the parallel channel. The named phases are then input to a data interpolator in each receiver, which generates 16 local phases. The 16 local phases correspond to the data-bit centers and data-bit edges for each of the 8 bits transferred per major channel clock period. In a bit-centering calibration step, a training pattern is evaluated by each receiver and each data interpolator dynamically adjusts a delay applied to the 16 local phases to establish the local center-data phases in the center of the bits received by the corresponding receiver. In an additional calibration step, on a per-wire basis, 8 contiguous bits are selected as the data outputs from a 10-bit window. The local center-data phases are used to serialize and de-serialize the channel data for the receiver. The present invention optimizes clock timing for each channel bit, thus providing the benefits of a dedicated DLL per channel bit, without the associated cost.

15 Claims, 21 Drawing Sheets

U.S. PATENT DOCUMENTS

| | | | |
|---|---|---|---|
| 5,524,234 A | | 6/1996 | Martinez, Jr. et al. |
| 5,526,380 A | * | 6/1996 | Izzard ........................ 375/375 |
| 5,535,363 A | | 7/1996 | Prince |
| 5,537,569 A | | 7/1996 | Masubuchi |
| 5,537,575 A | | 7/1996 | Foley |
| 5,553,310 A | | 9/1996 | Taylor et al. |
| 5,561,779 A | | 10/1996 | Jackson |
| 5,568,620 A | | 10/1996 | Sarangdhar et al. |
| 5,574,868 A | | 11/1996 | Marisetty |
| 5,577,204 A | | 11/1996 | Brewer et al. |
| 5,581,729 A | | 12/1996 | Nishtala et al. |
| 5,588,131 A | | 12/1996 | Borrill |
| 5,594,886 A | | 1/1997 | Smith et al. |
| 5,602,814 A | | 2/1997 | Jaquette et al. |
| 5,606,686 A | | 2/1997 | Tarui et al. |
| 5,634,043 A | | 5/1997 | Self et al. |
| 5,634,068 A | | 5/1997 | Nishtala et al. |
| 5,644,754 A | | 7/1997 | Weber |
| 5,655,100 A | | 8/1997 | Ebrahim et al. |
| 5,657,472 A | | 8/1997 | Van Loo et al. |
| 5,682,516 A | | 10/1997 | Sarangdhar et al. |
| 5,684,977 A | | 11/1997 | Van Loo et al. |
| 5,696,910 A | | 12/1997 | Pawlowski |
| 5,796,605 A | | 8/1998 | Hagersten |
| 5,829,034 A | | 10/1998 | Hagersten et al. |
| 5,895,495 A | | 4/1999 | Arimilli et al. |
| 5,897,656 A | | 4/1999 | Vogt et al. |
| 5,940,856 A | | 8/1999 | Arimilli et al. |
| 5,946,709 A | | 8/1999 | Arimilli et al. |
| 5,978,411 A | * | 11/1999 | Kitade et al. ................ 375/200 |
| 6,044,122 A | * | 3/2000 | Ellersick et al. ............ 375/360 |
| 6,065,077 A | | 5/2000 | Fu |
| 6,125,429 A | | 9/2000 | Goodwin et al. |
| 6,145,007 A | | 11/2000 | Dokic et al. |
| 6,279,084 B1 | | 8/2001 | VanDoren et al. |
| 6,289,420 B1 | | 9/2001 | Cypher |
| 6,292,705 B1 | | 9/2001 | Wang et al. |

OTHER PUBLICATIONS

White Paper, Eight–way Multiprocessing, Hewlett–Packard, Nov. 1997.

George White & Pete Vogt, Profusion, a Buffered, Cache–Coherent Crossbar Switch, presented at Hot Interconnects Symposium V, Aug. 1997.

Alan Charlesworth, et al., Gigaplane—XB: Extending the Ultra Enterprise Family, presented at Hot Interconnects Symposium V, Aug. 1997.

James Loudon & Daniel Lenoski, The SGI Origin: A ccNUMA Highly Scalable Server, Silcon Graphics, Inc., presented at the Proc. Of the $24^{th}$ Int'l Symp. Computer Architecture, Jun. 1997.

Mike Galles, Spider: A High–Speed Network Interconnect, IEEE Micro, Jan./Feb. 1997, pp. 34–39.

T.D. Lovett, R. M. Clapp and R. J. Safranek, NUMA–Q: an SCI–based Enterprise Server, Sequent, 1996.

Daniel E. Lenoski & Wolf–Dietrich Weber, Scalable Shared–Memory Multiprocessing, Morgan Kaufmann Publishers, 1995, pp. 143–159.

David B. Gustavson, The Scalable coherent Interface and Related Standards Projects, (as reprinted in Advanced Multimicroprocessor Bus Architectures, Janusz Zalewski, IEEE computer Society Press, 1955, pp. 195–207.).

Kevin Normoyle, et al., UltraSPARC TM Port Architecture, Sun Microsystems, Inc., presented at Hot Interconnects III, Aug. 1995.

Kevin Normoyle, et al., UltraSPARC TM Port Architecture, Sun Microsystems, Inc., presented at Hot Interconnects III, Aug. 1995, UltraSparc Interfaces.

Kai Hwang, Advanced Computer Architecture: Parallelism, Scalability, Programmability, McGraw–Hill, 1993, pp. 355–357.

Jim Handy, The Cache Memory Book, Academic Press, 1993, pp. 161–169.

Angel L. Decegama, Parallel Processing Architectures and VLSI Hardware, vol. 1, Prentice–Hall, 1989, pp. 341–344.

* cited by examiner

ACCURATE TIMING CALIBRATION FOR EACH OF MULTIPLE HIGH-SPEED CLOCKED RECEIVERS USING A SINGLE DLL

CROSS-REFERENCE TO RELATED APPLICATIONS

This patent application is a continuation-in-part of the following commonly-owned, U.S. patent application Ser. Nos.: U.S. application Ser. No. 08/986,430, AN APPARATUS AND METHOD FOR A CACHE COHERENT SHARED MEMORY MULTIPROCESSING SYSTEM, filed Dec. 7, 1997, now U.S. Pat. No. 6,065,077; U.S. application Ser. No. 09/163,294, METHOD AND APPARATUS FOR ADDRESS TRANSFERS, SYSTEM SERIALIZATION, AND CENTRALIZED CACHE AND TRANSACTION CONTROL, IN A SYSMETRIC MULTI-PROCESSOR SYSTEM, filed Sep. 29, 1998, now U.S. Pat. No. 6,292,705; and U.S. application Ser. No. 09/281,749, CACHE INTERFACE AND PROTOCOLS FOR CACHE COHERENCY IN A SCALABLE SYMMETRIC MULTI-PROCESSOR SYSTEM, filed Mar. 30, 1999; all of which are incorporated by reference herein.

BACKGROUND

As the computer, network, and software industries advance, there are increasing demands for high-speed and high-bandwidth inter-chip and inter-chassis interconnections. Bandwidth and latency of data flow are increasingly becoming limiting factors in increasing system performance. Traditional I/O technology, such as TTL, GTL, and HSTL can not provide the data transfer rates required by emerging system bandwidth requirements. Serial interconnects such as fiber-channel do provide Gigabit data rates, but with only one pair of differential wires. The emerging system requirements demand Gigabit data rates for each bit of a multiple-bit parallel channel. High-speed serial channels with clock forwarding operate with the benefit of a dedicated Delay Lock Loop (DLL), or Phase Lock Loop (PLL), for the channel's single bit. For parallel multiple-bit channels, a dedicated DLL per bit would be very expensive. Thus fiber-channel, per se, cannot meet new bandwidth demands and additionally has problematic power consumption and latency.

A typical emerging requirement calls for transfers of the equivalent of 80-bits worth of data at 200 MHz. Even when the clock is forwarded in parallel with the data (clock forwarding), it is very difficult to predict and match clock timing across all incoming data for such high-speed parallel interconnects. In present systems with only a single clock for multiple parallel data bits, skew between the data bits cannot be tolerated. In the prior art systems, the data rate has been limited by transmission error rate requirements to those rates where the skew inherent in the channel configuration is negligible compared to the width of a bit-time.

SUMMARY

The present invention optimizes clock timing for each received channel bit while only using a single DLL for all received bits. It thus provides the benefits of a dedicated DLL per received channel bit, without the associated cost. (In a preferred embodiment each group of transmitter bits also employs an additional associated PLL.) The present invention permits data rates as high as 1.6 Gbit/s on each pair of differential wires of a multiple-bit parallel channel. This rate is achieved even with data skew between data bits as large as 2-bit-times. In a preferred embodiment, the invention uses an 8-to-1 data serialization circuit in the transmitter to convert 80-bit parallel 200 MHz data to 10-bit parallel 1.6 Mb/s data. The data is signaled over a multiple-bit parallel channel that uses 10-bits transmit, 10-bits receive, and a forwarded clock in each of two directions. On the receiver side, the serialized data are captured using a forwarded clock and de-serialized. A DLL generates 16 master phases without reference to the word boundaries of data being transmitted. These 16 unreferenced phases are input to a phase rotator that, via a series of calibration steps, maps the unreferenced phases into named phases, and in doing so references the phases to the word boundary of the data being transmitted over the slowest data line of the parallel channel. The named phases are then input to a data interpolator in each receiver, which generates 16 local phases. The 16 local phases correspond to the data-bit centers and data-bit edges for each of the 8 bits transferred per miajor channel clock period. In a bit-centering calibration step, a training pattern is evaluated by each receiver and each data interpolator dynamically adjusts a delay applied to the 16 local phases to establish the local center-data phases in the center of the bits received by the corresponding receiver. In an additional calibration step, on a per-wire basis, 8 contiguous bits are selected as the data outputs from a 10-bit window. The local center-data phases are used to serialize and de-serialize the channel data for the receiver.

The present invention finds particular application in the design of the channel interface circuitry for contemporary high-speed multiprocessor systems, such as those disclosed in the applications previously incorporated by reference above.

BRIEF DESCRIPTION OF DRAWINGS

FIG. 1c is a block diagram of the calibration control logic 700 of FIG. 1a.

FIG. 10 is the circuit diagram of the 8-to-1 multiplexer blocks 7510 of the phase rotator of FIG. 9a.

DETAILED DESCRIPTION

Figure 1A:
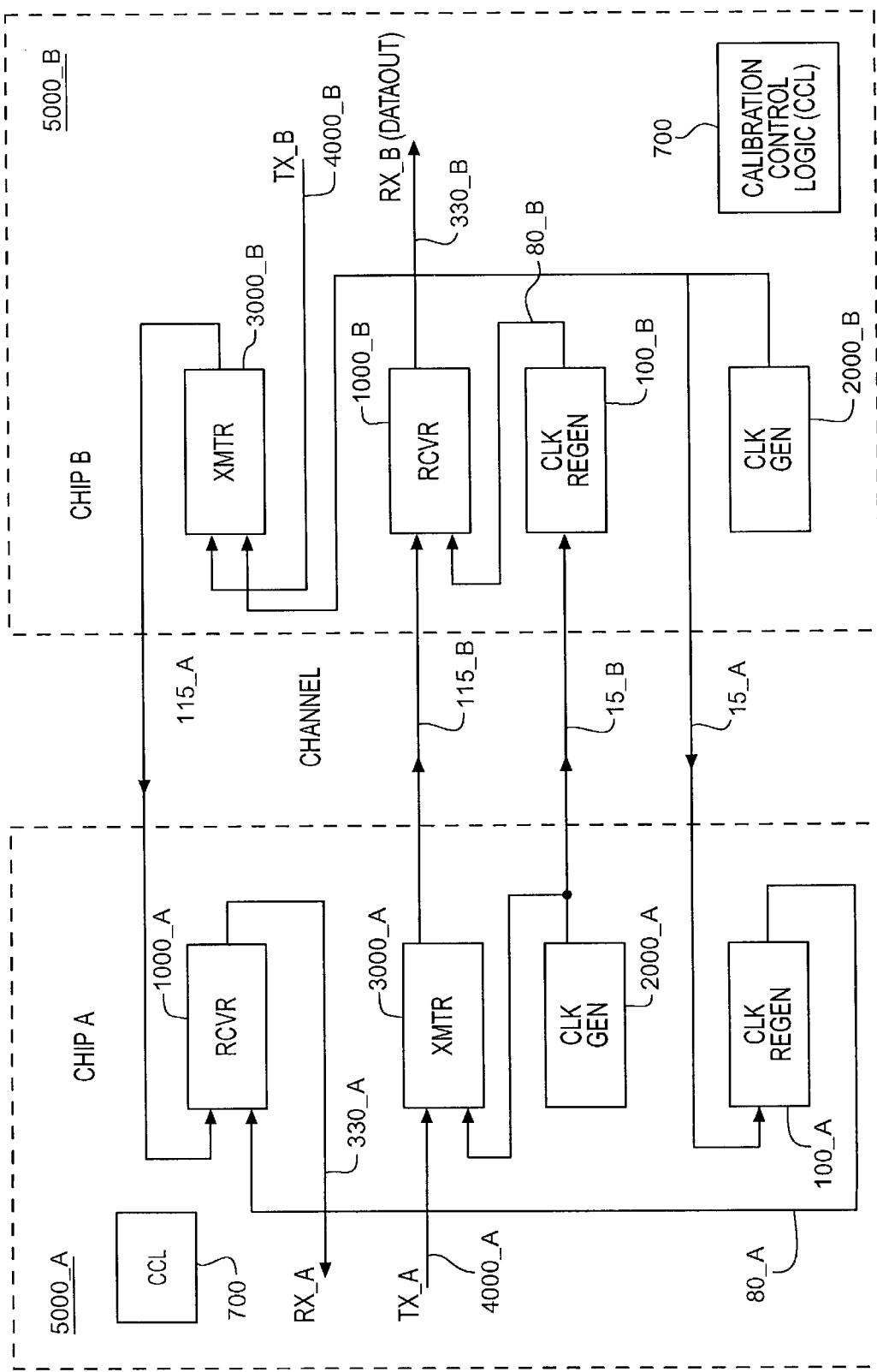
FIG. 1a is an abstract drawing showing one system environment in which the invention functions.
Figure 1B:
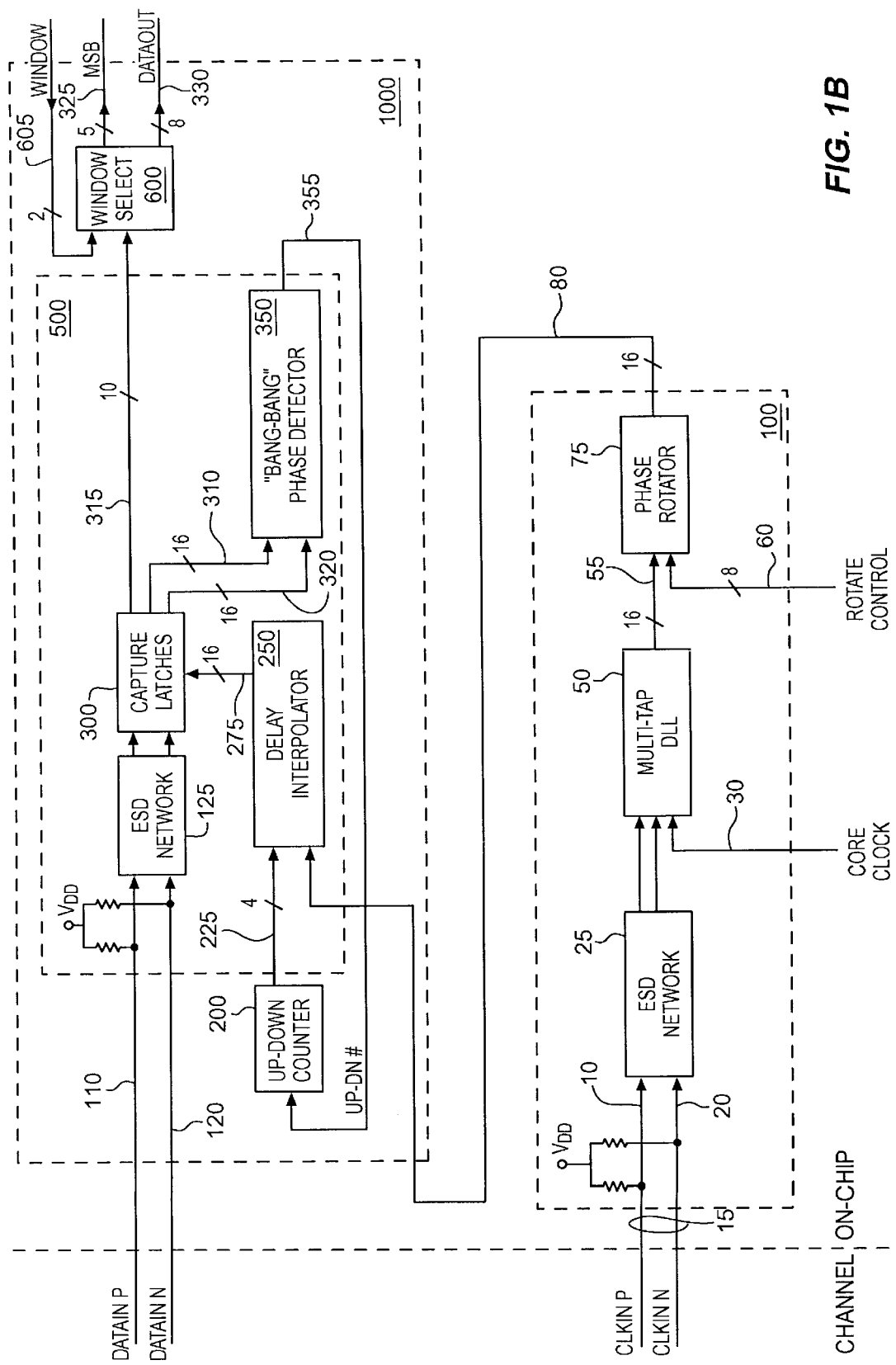
FIG. 1b is a block diagram of the major components of the invention.
Figure 1C:
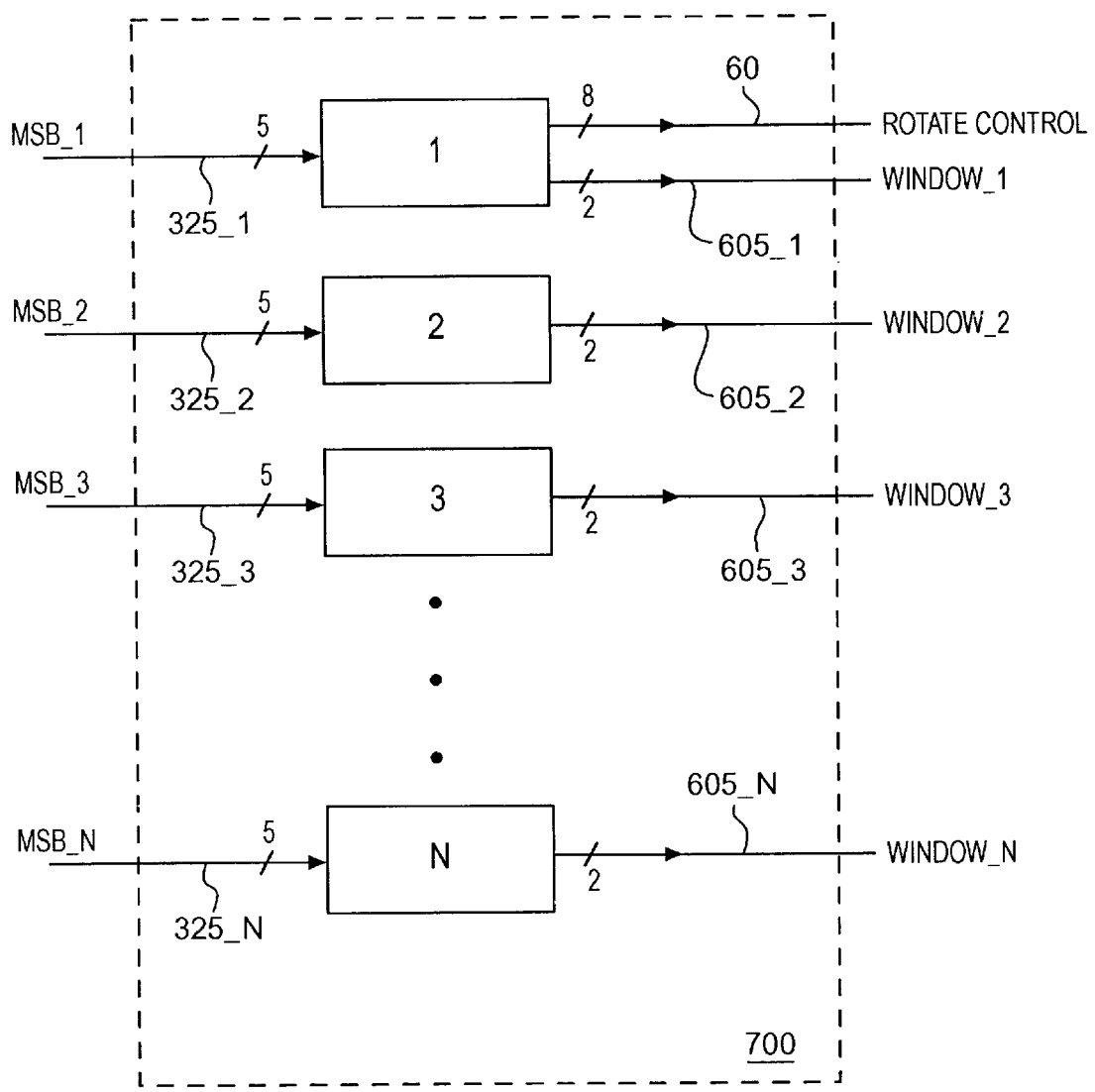
Figure 2:
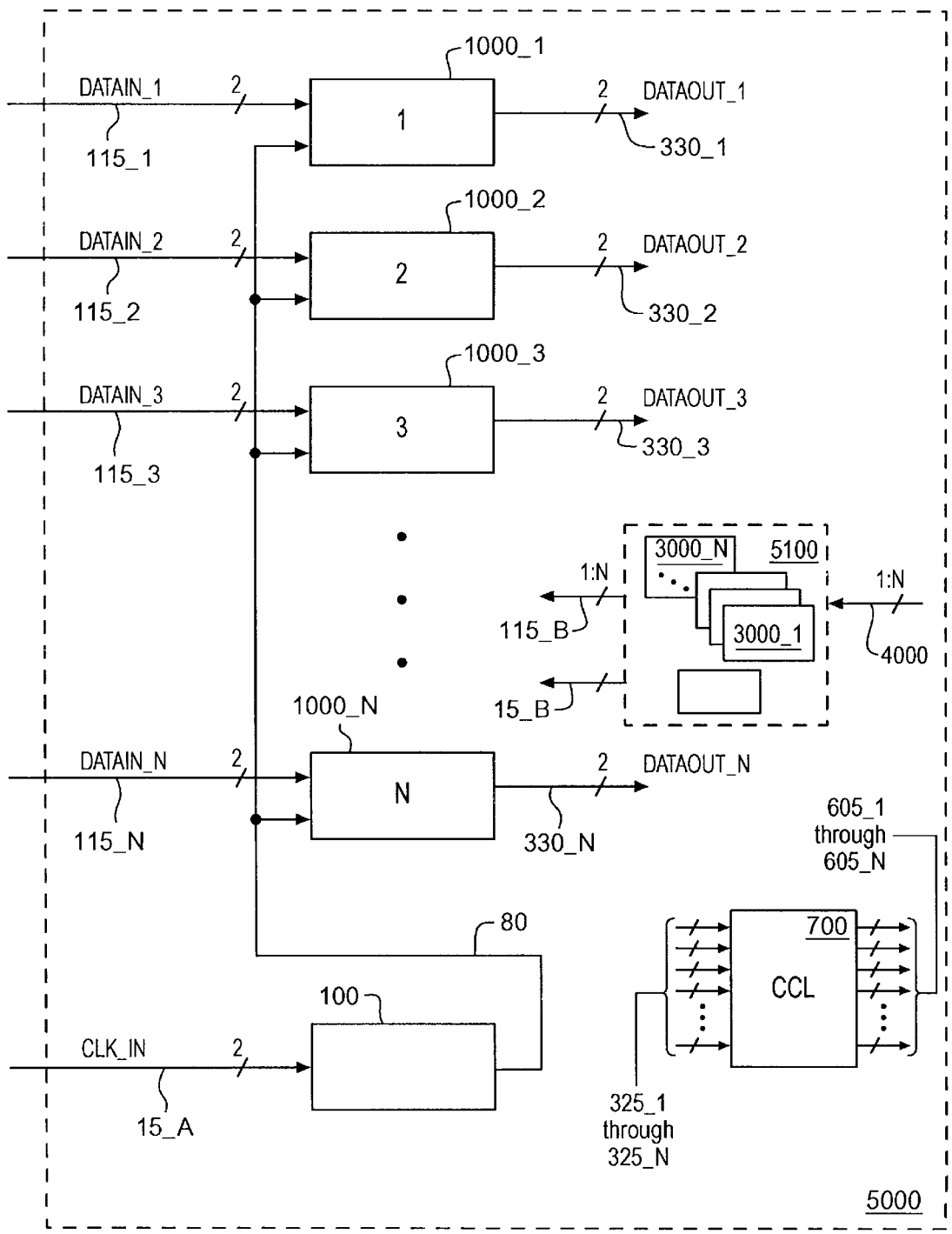
FIG. 2 illustrates how the receiver and transmitter logic of FIGS. 1a and 1b is extended for use in multiple bit parallel data channels.
Figure 3A:
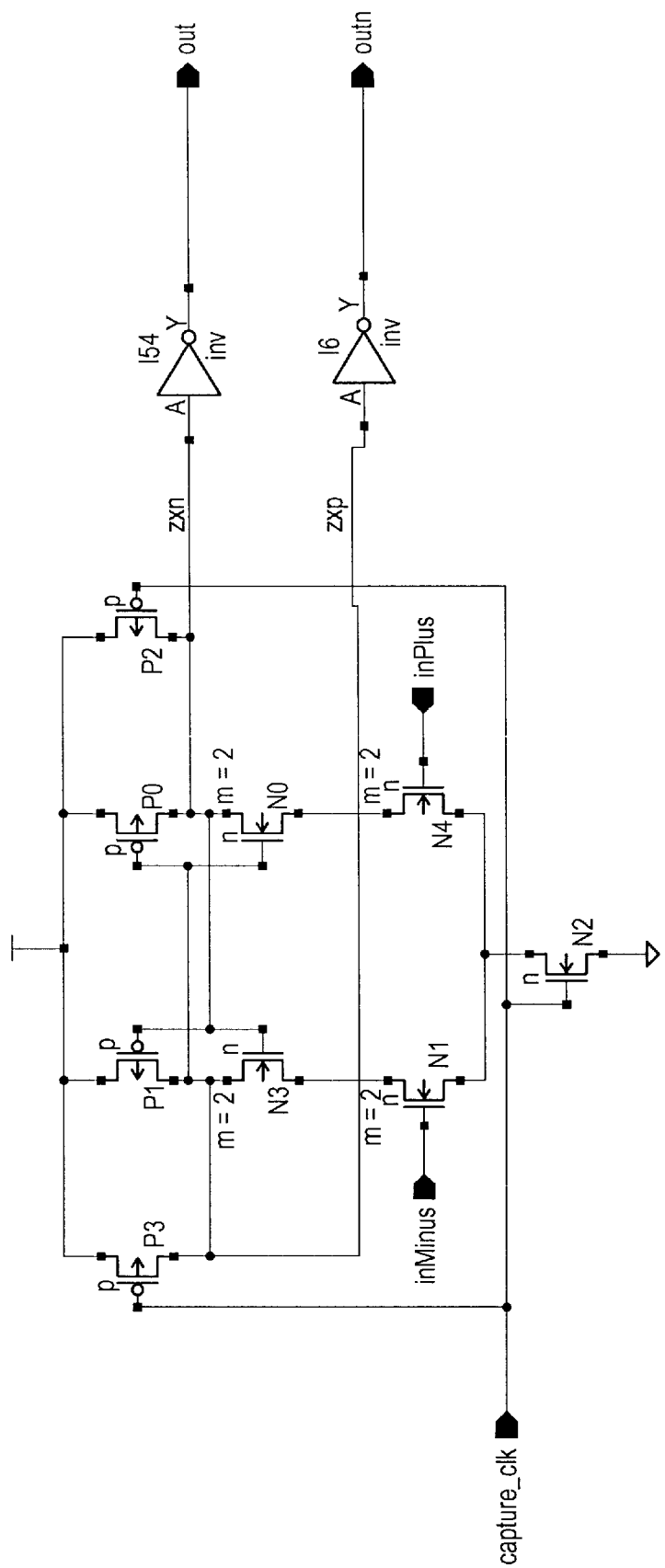
FIGS. 3a–d show the circuitry and function blocks that make up the per-bit receive logic of block 500 of FIG. 1b.
Figure 3B:
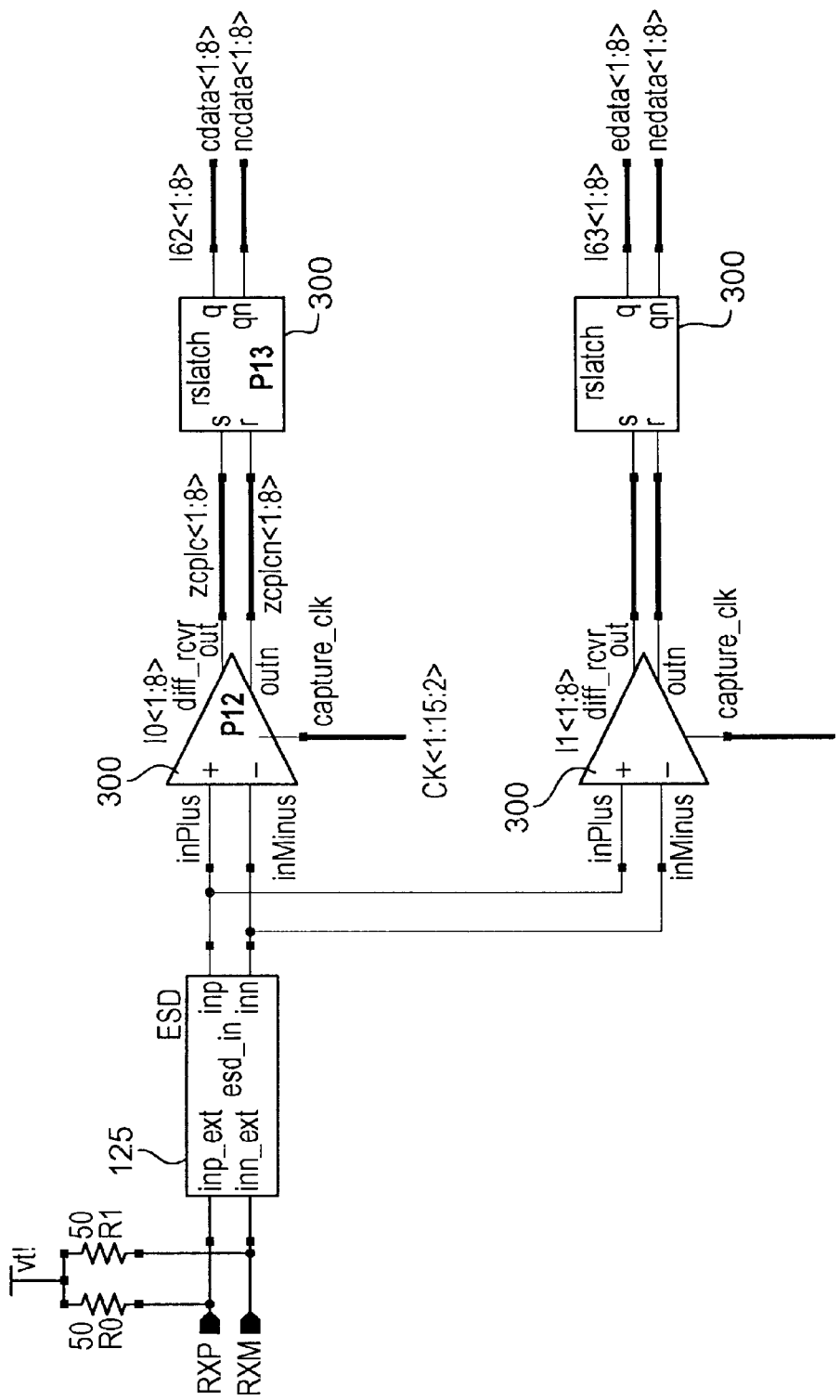
Figure 3C:
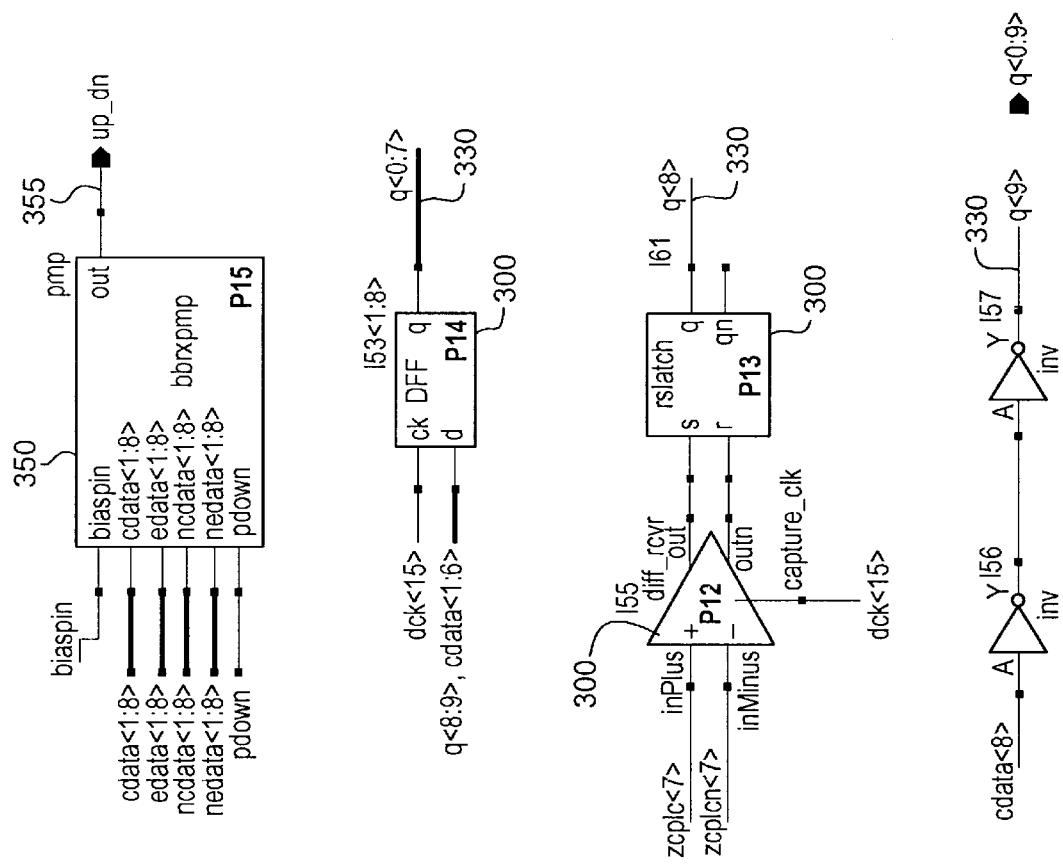
Figure 3D:
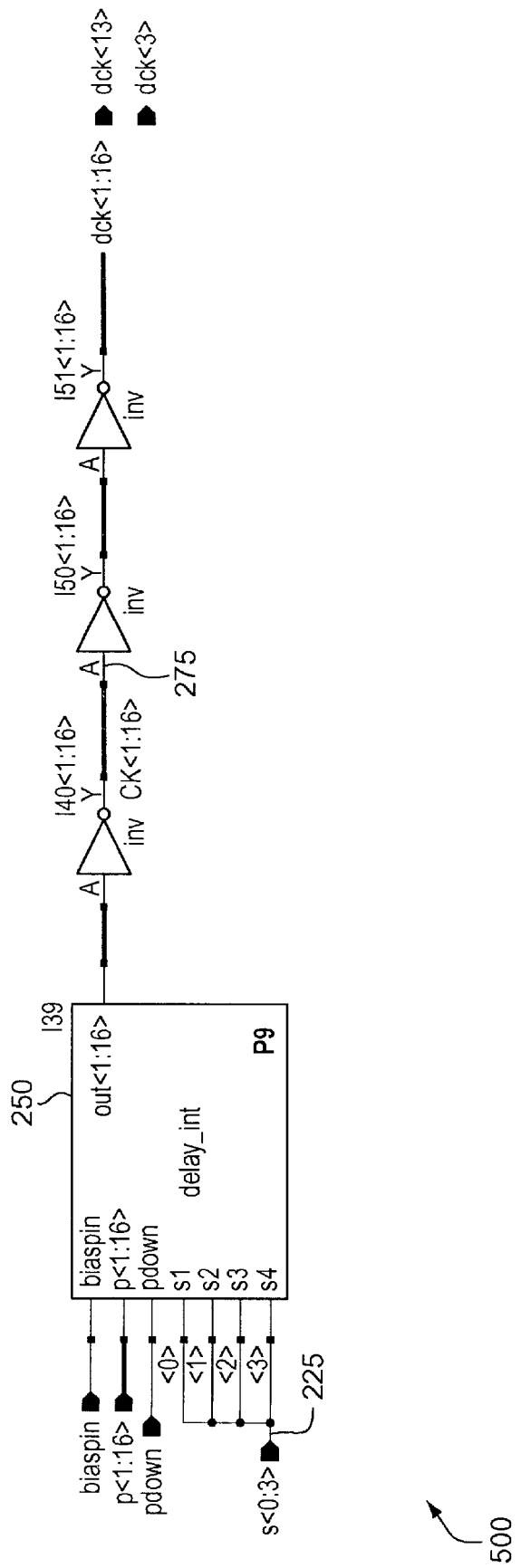
Figure 4:
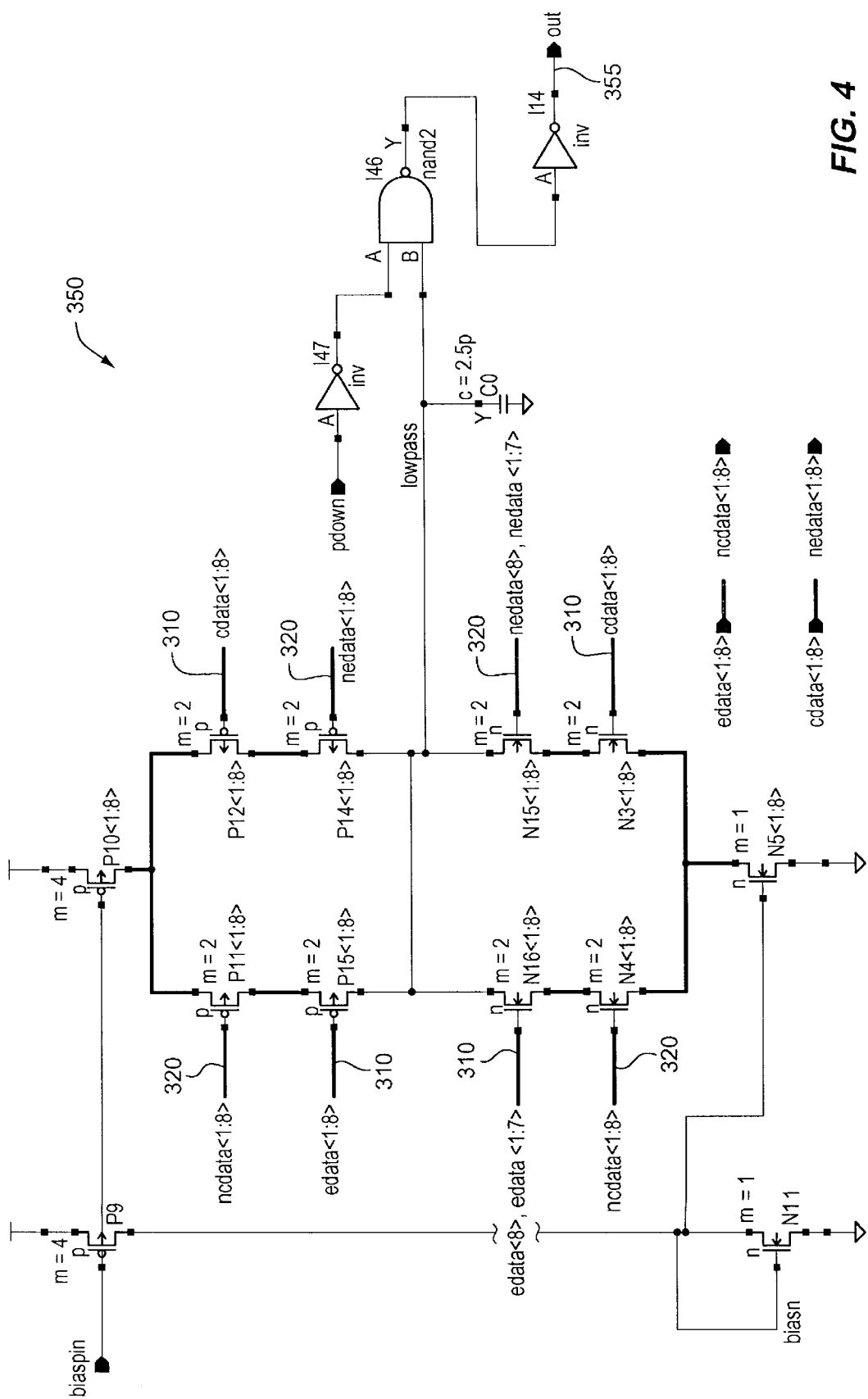
FIG. 4 is a circuit diagram of the phase detector 350 of FIG. 1b and FIG. 3c.
Figure 5:
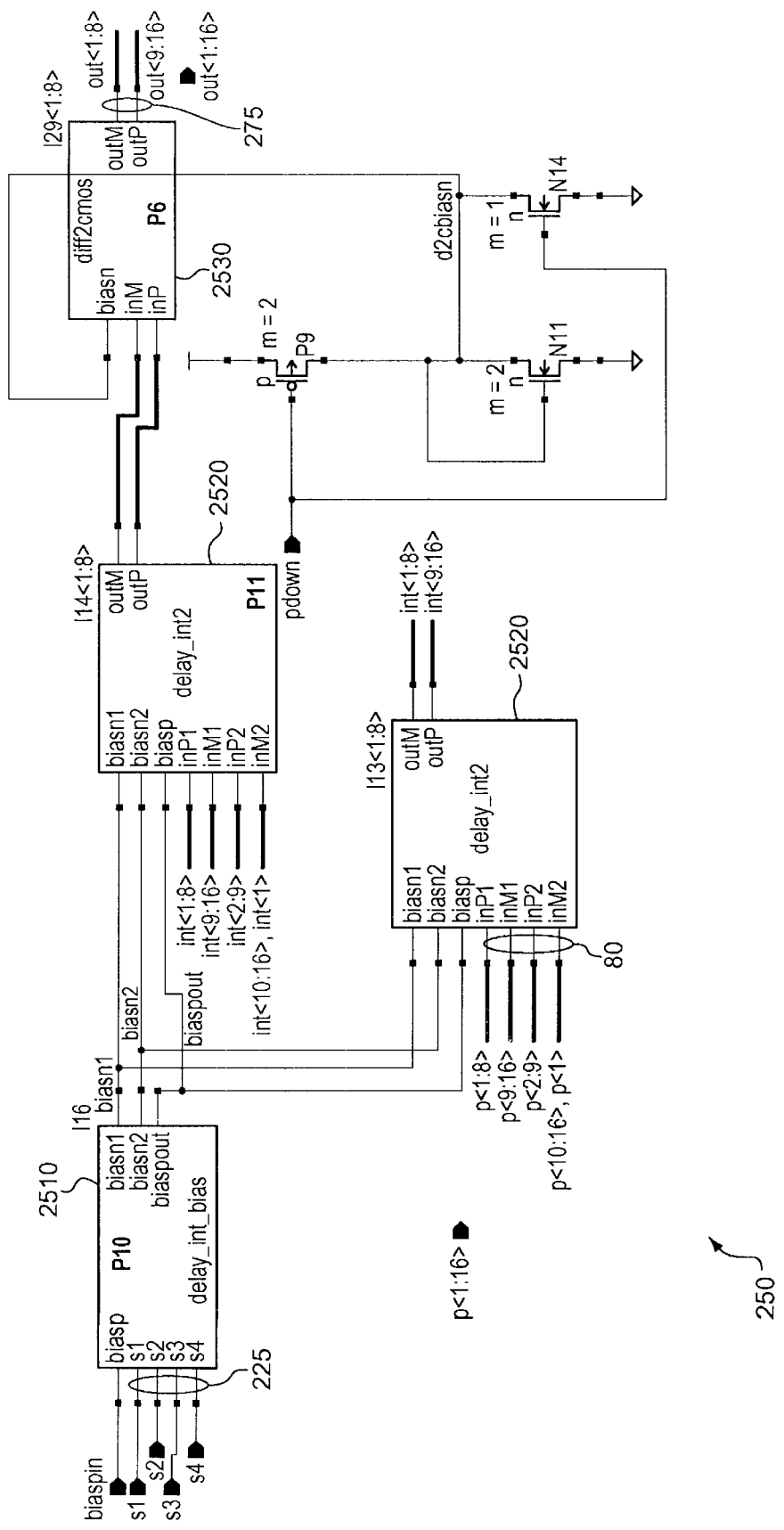
FIG. 5 shows the circuitry and function blocks that make up the delay interpolator block 250 of FIG. 1b and FIG. 3d.
Figure 6:
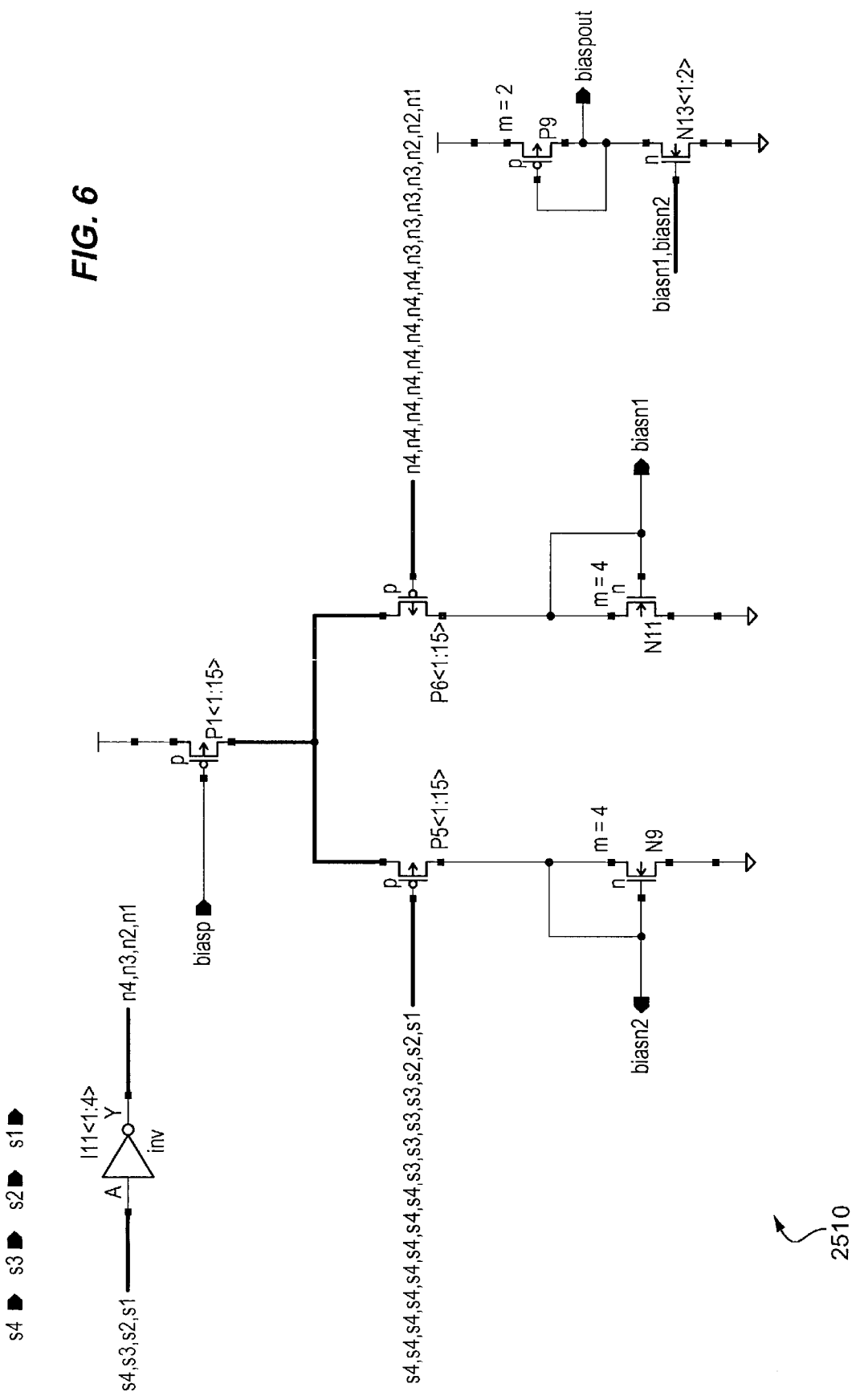
FIG. 6 is the circuit diagram of the bias block 2510 of the delay interpolitor of FIG. 5.
Figure 7:
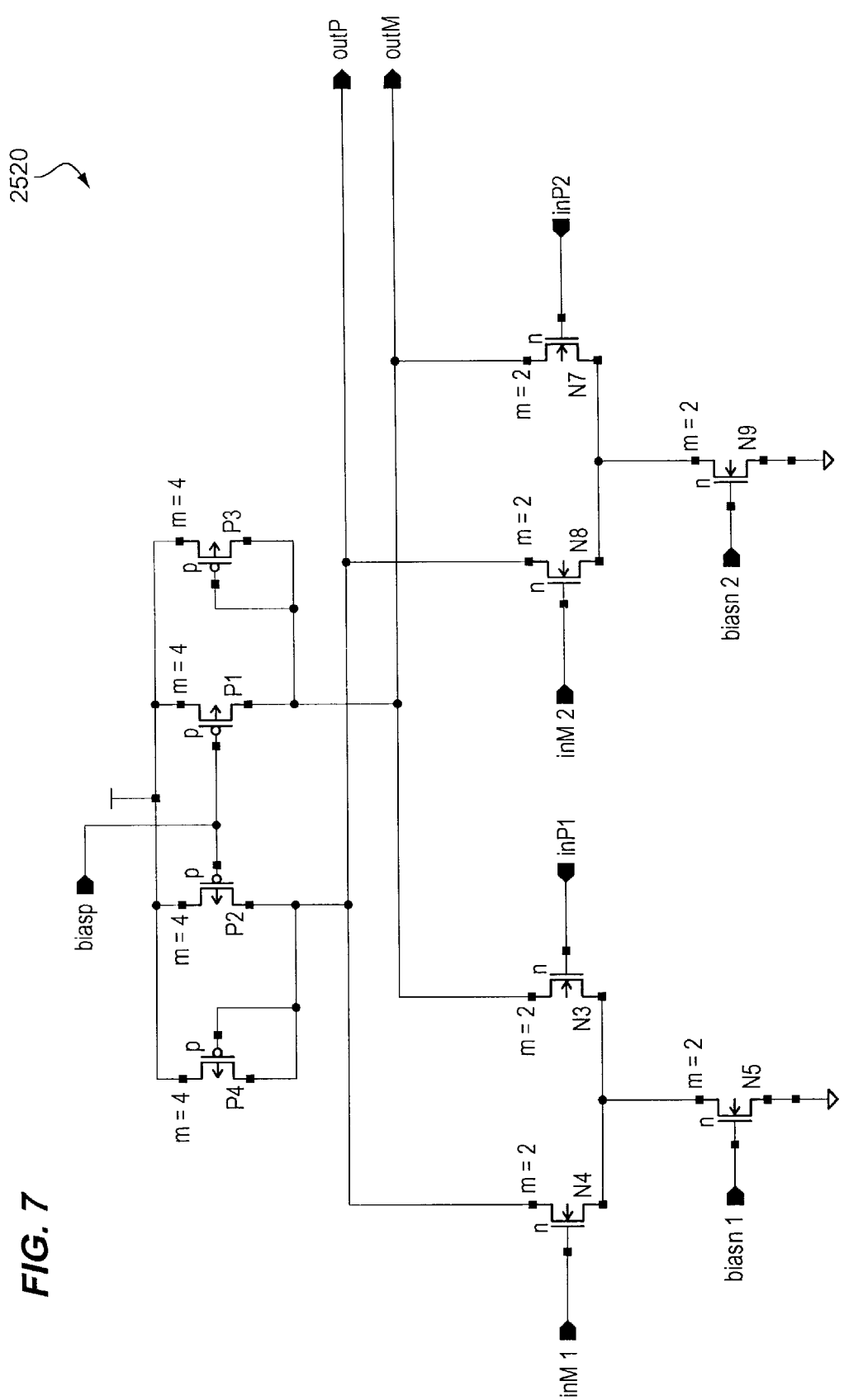
FIG. 7 is the circuit diagram of the delay stages 2520 of the delay interpolator of FIG. 5.
Figure 8:
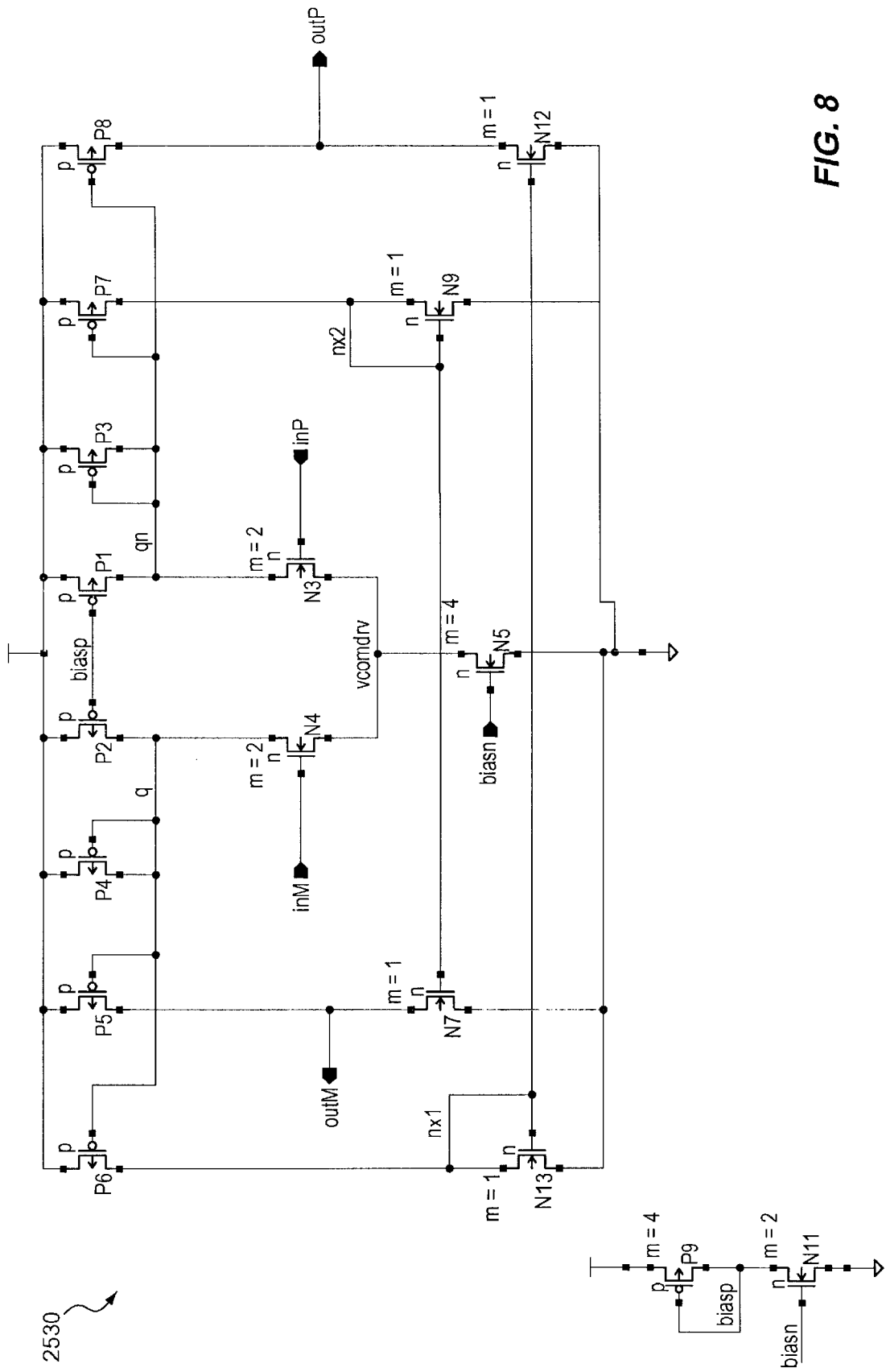
FIG. 8 is the circuit diagram of the diff2cmos block 2530 of the delay interpolator of FIG. 5.
Figure 9A:
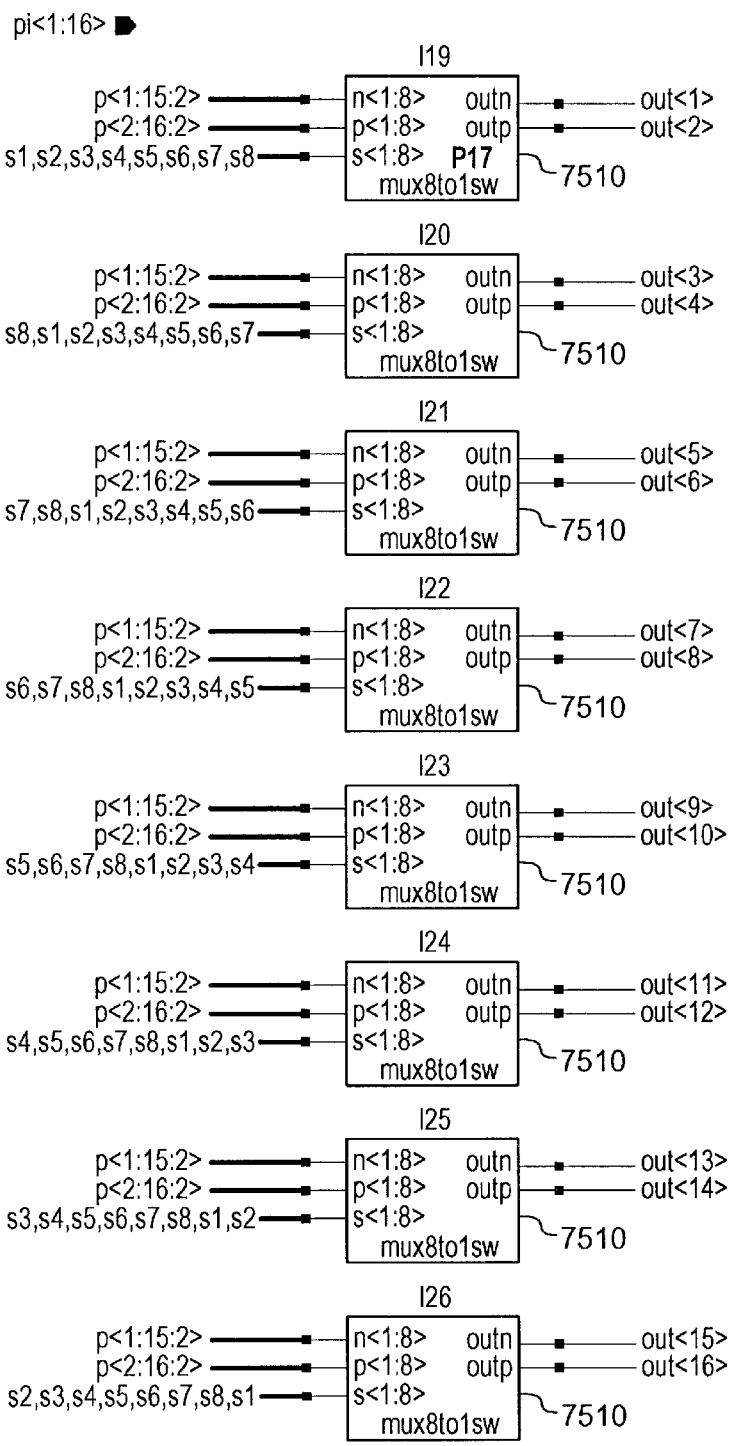
FIGS. 9a–b is the circuitry and function blocks of the phase rotator 75 of FIG. 1b.
Figure 9B:
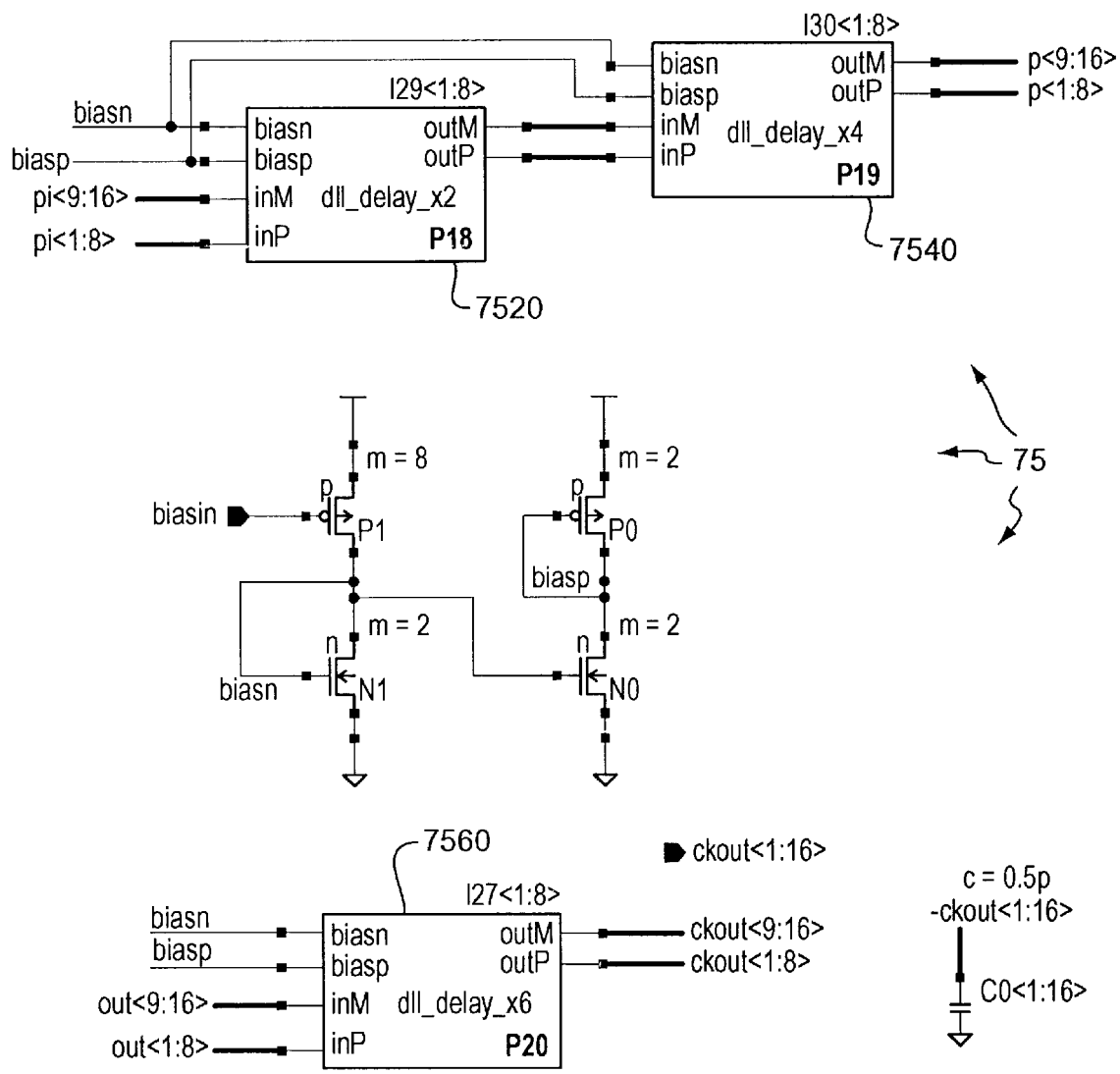
Figure 10:
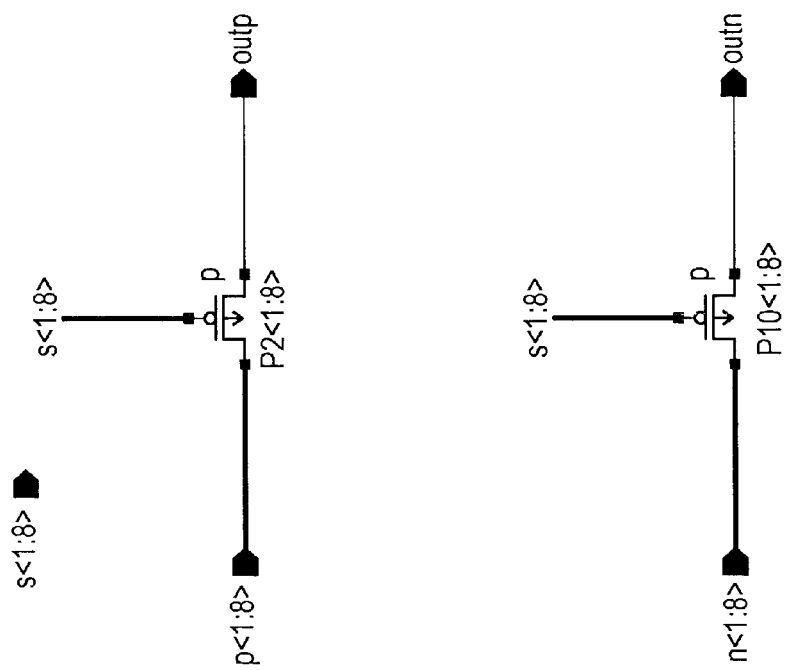
Figure 11:
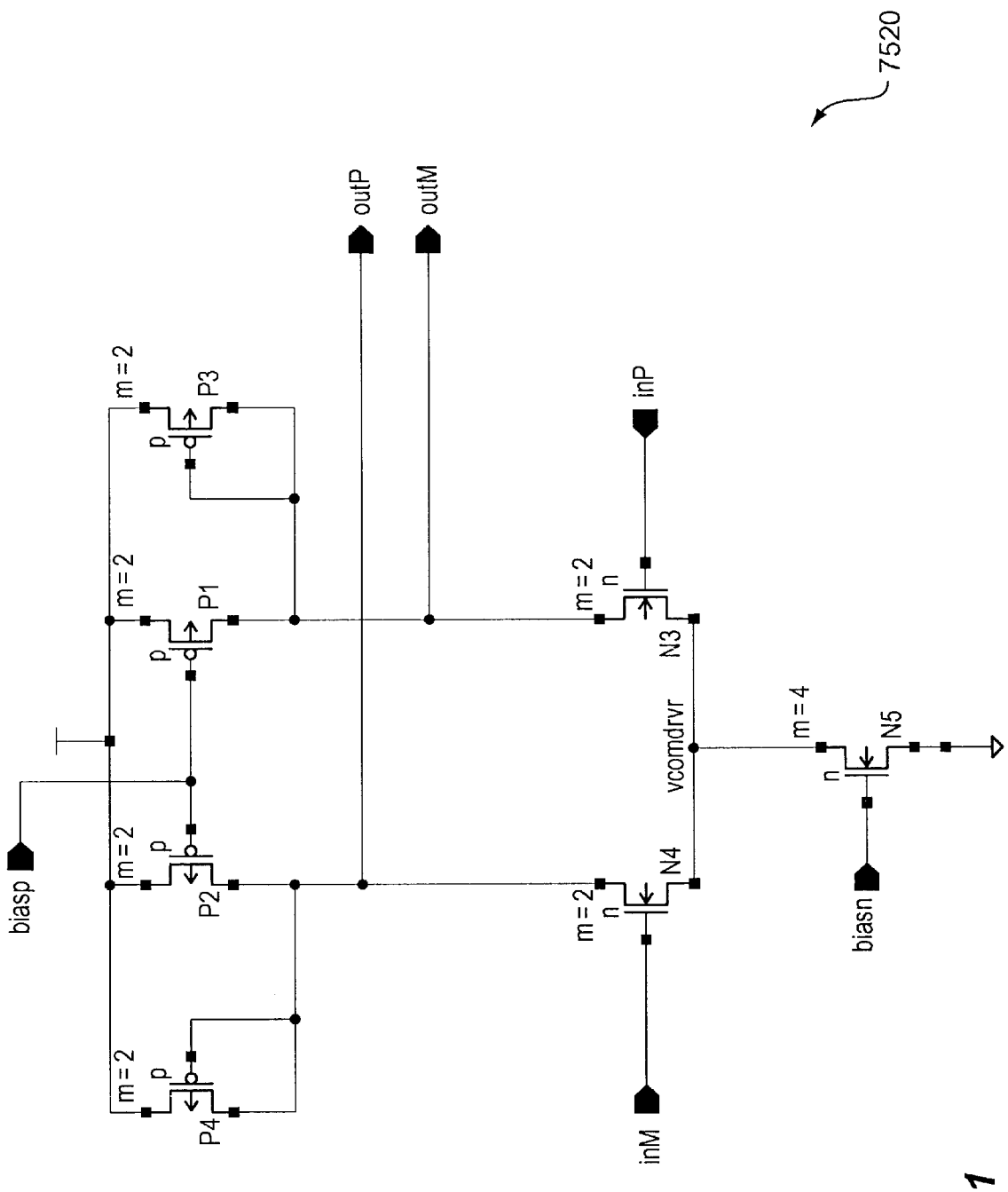
FIG. 11 is the circuit diagram of the d11_delay_x2 block 7520 of the phase rotator of FIG. 9b.
Figure 12:
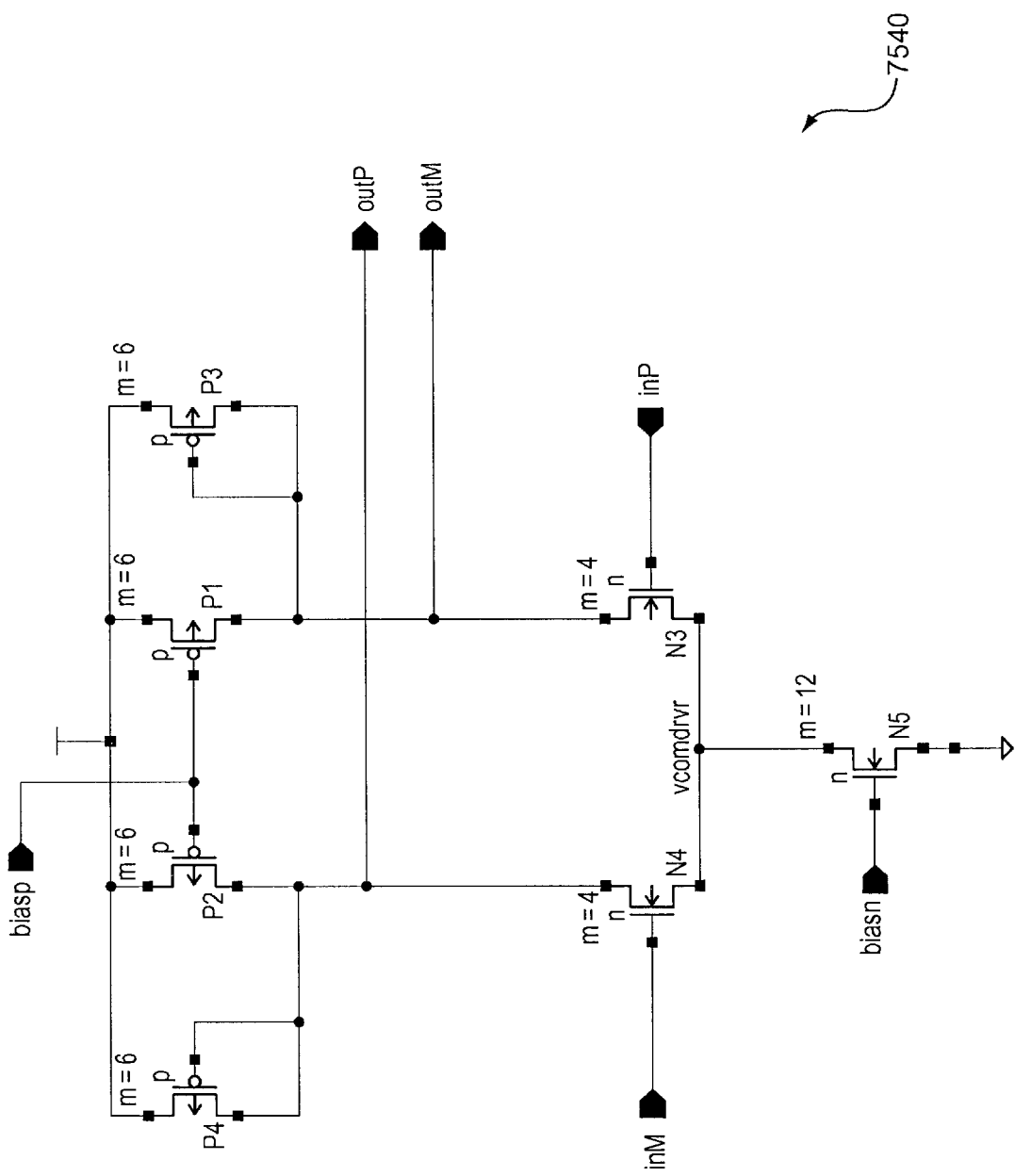
FIG. 12 is the circuit diagram of the d11_delay_x4 block 7540 of the phase rotator of FIG. 9b.
Figure 13:
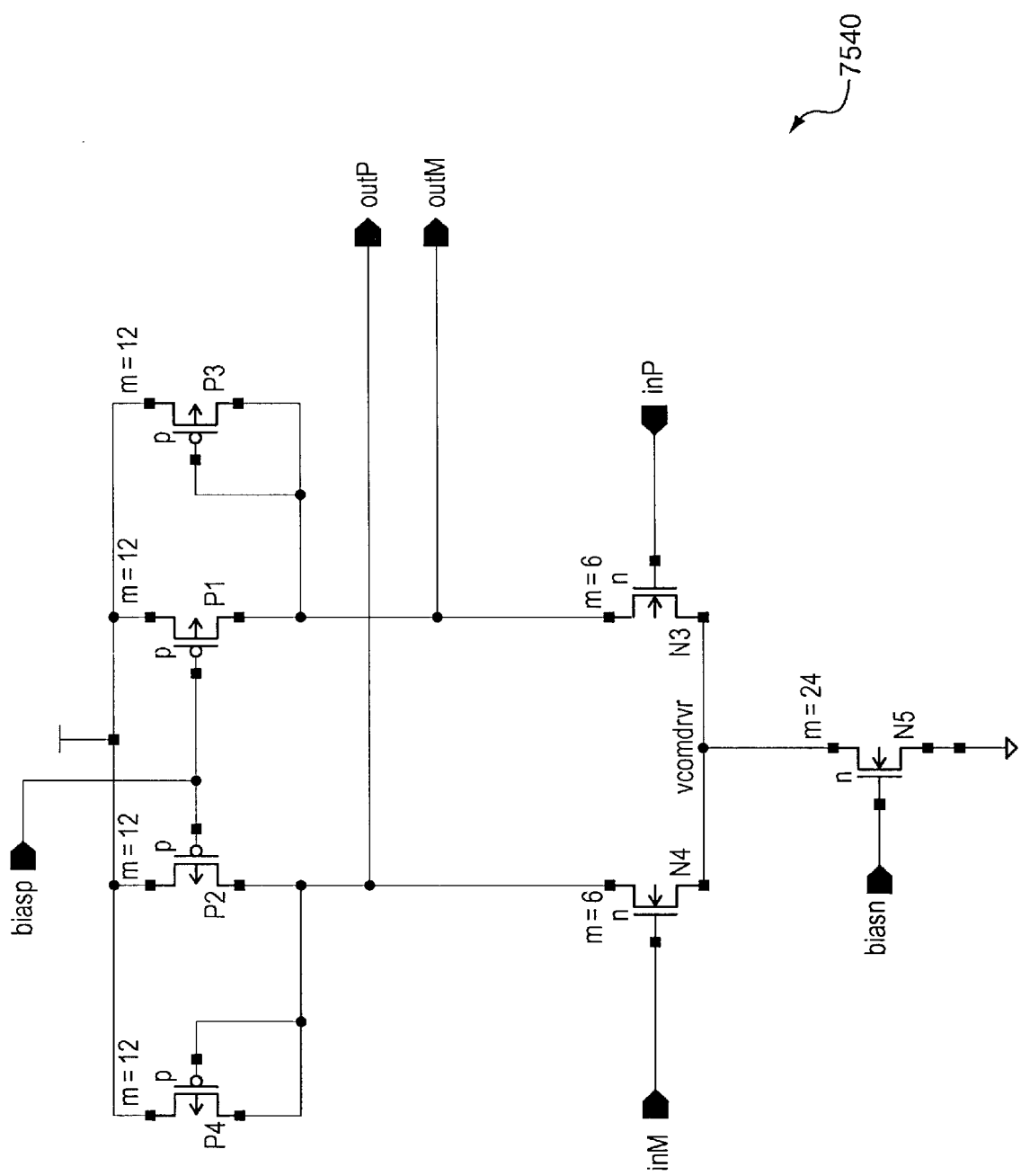
FIG. 13 is the circuit diagram of the d11_delay_x6 block 7560 of the phase rotator of FIG. 9b.
Figure 14:
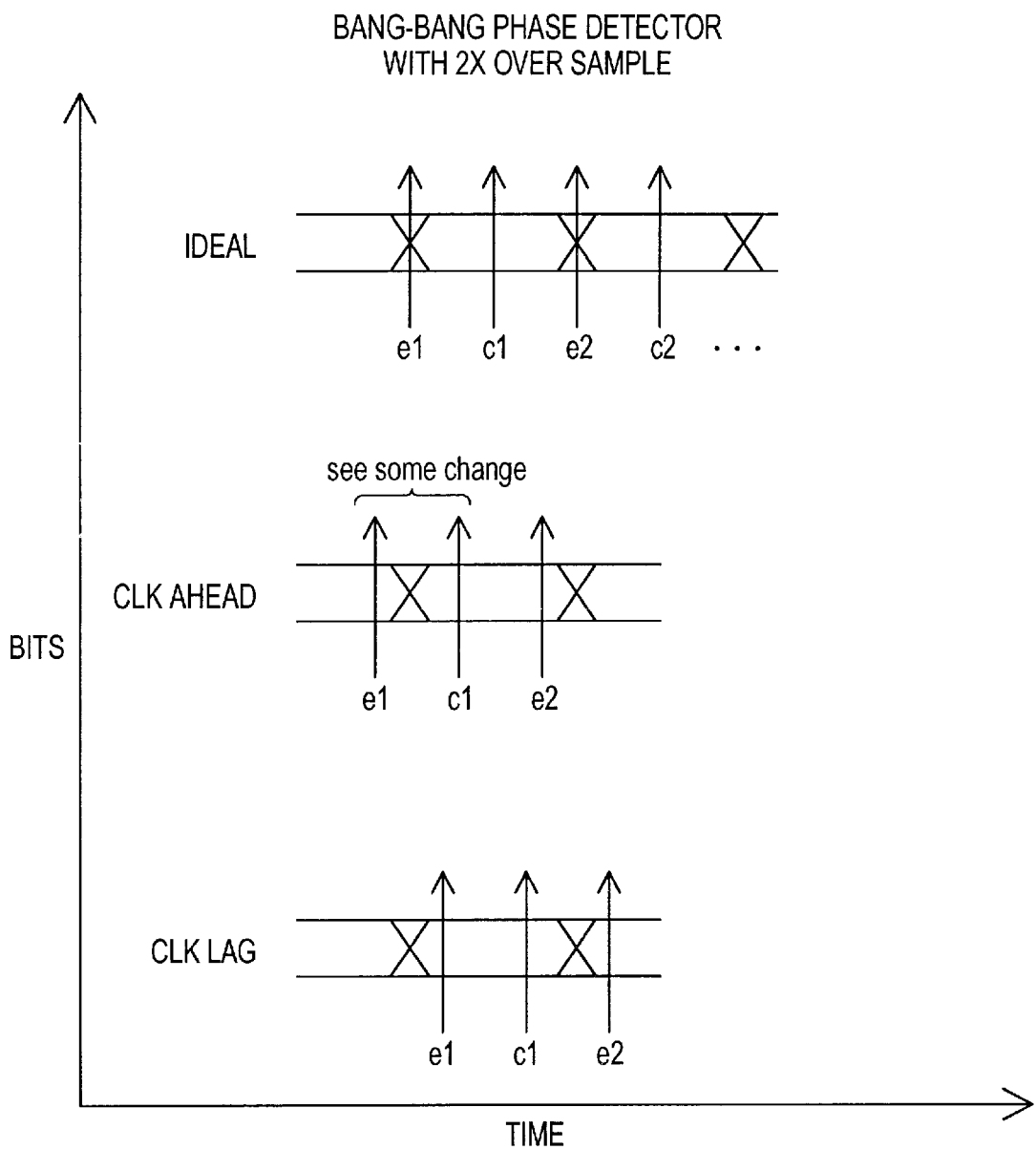
FIG. 14 shows timing diagrams showing the possible bit-centering calibration cases.
Figure 15:
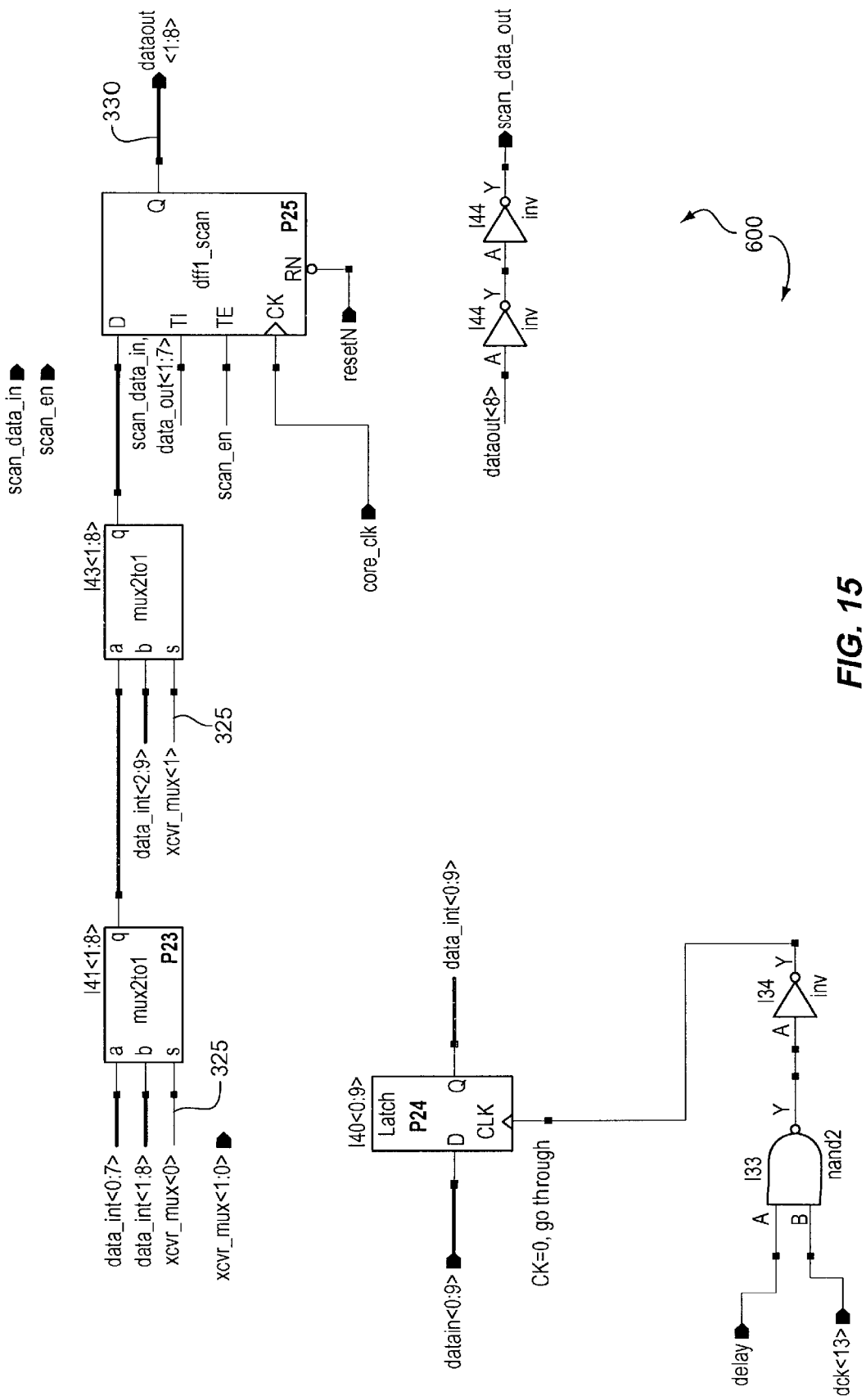
FIG. 15 is a diagram of the window selection logic 600 of FIG. 1b.

FIG. 1a is an abstract drawing showing the system environment of an illustrative embodiment. The invention is incorporated into the channel transceiver logic of each of two chips in communication with each other over a point-to-point communications channel. FIG. 2 illustrates how the receiver and transmitter logic of FIGS. 1a and 1b is extended for use in multiple-bit parallel data channels in a preferred embodiment. The data is signaled over a multiple-bit parallel channel that uses 10-bits transmit, 10-bits receive, and a forwarded clock in each of two directions. An 8-to-1 data serialization circuit in the transmitter to convert 80-bit parallel 200 MHz data to 10-bit parallel 1.6 Mb/s data.

FIG. 1b is a block diagram of the major components of the invention. Block 100 includes ESD Network 25, a Multi-tap DLL, and a phase rotator (also referred to as a clock switch) 75. As illustrated in FIG. 2, only one block 100 is implemented for a plurality of channel bit lines. FIGS. 3A–D show the circuitry and function blocks that make up the per-bit receive logic of block 500 of FIG. 1b. Block 500 is replicated for each channel data-bit.

Receiver Clock Distribution and Local Delay Interpolation

The receiver converts the incoming 200 MHz clock 15 into 16 phases (8 center data phases and 8 edge data phases) 55 with a Delay Locked Loop (DLL) 50 having multiple taps (one tap per phase output) . The beginning of each phase is separated by 312 ps. These clocks (phases) are then fed into a clock phase rotator 75 controlled by 3-bit digital control signals 60. The 16 clock phases out 80 of the clock phase rotator are distributed to each per-wire data receiver 1000. Each data receiver has its own delay interpolator 250, which is controlled by 4 bit digital signals 225, and capable of delaying the clock Lip to one dlata bit (625 ps). Each data receiver has 16 differential data capture latches 300 that are timed by the 16 clock phases 275 generated from its local delay interpolator. The purpose of this delay interpolation is to optimize the clock position relative to data bits.

Per-wire Bit-Timing Adjustments

A preferred training pattern of 10100111 is used. This patter has enough transition edges to permit bit-timing adjustment. Under control of calibration control logic 700, the pattern is 2× over-sampled every 64 core clock cycles and compared in a charge pump circuit 350 to provide an up/down signal 355 to indicate the required direction of local clock edge movement. The bit timing adjustments will converge within a few microseconds.

During the convergence interval the charge pump effectively performs statistical averaging of the bit-centering status over all the bit lines. More specifically, the charge pump implements an exclusive-or compare of the pattern data sampled by the center and edge clock phases for each bit line. The pump ties the output circuitry of each exclusive-or to a single capacitor that is charged in accordance with the cumulative effect of the switching currents from all the individual exclusive-or compares. A logic gate then evaluates the capacitor voltage in accordance with the logic switching thresholds of the evaluation gate.

Training Pattern and Sequence

Calibration can be triggered through either re-calibration signal from core logic or a poweron reset. The training pattern we choose is "10100111". The pattern has following advantages:

1. The pattern provides different transmitting data pulse width
2. It provides enough 1-to-0 and 0-to-1 transition that required by bit timing 2 adjiulistments
3. Every 5 sequential bits in this pattern is unique, (hat simplifies the logic for identifying the receiving data and it phase rotation.
   10100
   01001 or
   10011 or
   10011 or
   01111 or
   11110 or
   11101 or
   11010

We partition the transceiver into two major blocks, analog front-end and digital control logic.

The training sequence is as follows,

1. When digital control logic receives a PLL lock signal during power-on or a re-calibration request from core logic, it generates a reset signal that resets all registers inside the transceiver control logic block.
2. Phase 1 of the 200 MHz Tx PLL clock is forwarded to Rx of the receiving chip. The Tx PLL is locked after about 200 us, and then generates and internal txp11_ lock signal.
3. For each transceiver macro, once the local Tx PLL is locked and the forwarded clock is detected, the control logic will generate the training pattern for Tx to transmit. Reset1 and Reset2 are asserted for Rx DLL to lock. Reset1 is de-asserted after 200 ns and Reset2 is de-asserted after 1 us.
5. 1 us after Reset2 is de-asserted, the Rx starts the per-wire bit-timing adjustment as described earlier in the section on "per-wire bit-timing adjustment." Eventually, for each data line, the capture clock will be centered in the middle of the data bit for optimum setup and hold time margins. The process takes 5.2 us.
6. After the per-wire bit-timing adjustment is completed, control logic reads the 5 MSB 325 from the received data pattern on the reference data line (an arbitrary pre-determined one from all ten lines) to decide how many bits of master phase rotation is needed to align the byte boundary of the reference wire. For example, if the pattern 11010 is received, the phase is rotated forward by 1 bit, i.e. phase1 to phase2, phase2 to phase3, etcetera. This is accomplished by an 8 bit control signal 60 and the phase rotator (clock switch) block 75.
7. Once the phase rotation is completed, the reference data line will output the training pattern. Due to different wire delays and other factors however, other data lines may be skewed by 1 or 2 bits relative to the reference data line. To correct for this potential problem, the most recent 2 test pattern bits (the 2 LSB) from the previous byte are retained (captured). Thus, a 10-bit timing window 315 is defined that includes 8 bits from the current byte transfer and 2 bits from the previous byte transfer. Control logic 700 then exams all data lines to determine the slowest data line of the bundle, and rotates the master phase again to align the byte boundary of the slowest wire.
8. Once this alignment is done, the 3 MSB of each wire are used to select (truncate) on a per-wire basis 8 contiguous bits 330 out of the 10-bit timing window. This is performed in window select logic 600 using control signal 605.

101 select latest 8 bits (i.e., the most recent, or the MSB, of the 10-bit window)
110 select middle 8 bits
111 select earliest 8 bits (i.e., the least recent, or the LSB, of the 10-bit widow), 9. The transceiver control logic waits for an additional 1 us to switch from training pattern to normal data path. A calibration_done signal is output to the core logic indicating that transceiver is ready for normal data transmission.

CONCLUSION

The invention broadly permits accurate timing calibration for each of multiple high-speed clocked transceivers using a single DLL. As would be apparent to one skilled in the art given this description, the present invention is not limited to differential signaling, a particular fabrication technology, particular clock rates or data widths, or a particular training pattern.

While various embodiments of the present invention have been described above, It should be understood that they have been presented by way of example only, and not limitation. It will be understood by those skilled in the art that various changes in form and details may be made herein without departing from the spirit and scope of the invention as defined in the appended claims. Thus, the breadth and scope of the present invention should not be limited by any of the above-described exemplary embodiments, but should be defined only in accordance with the following claims and their equivalents.

We claim:

1. A method of retrieving data transmitted over a communications channel, the method comprising:

providing a Delay Locked Loop (DLL);

generating a first plurality of unreferenced master phases using the DLL;

mapping the unreferenced phases into named phases to reference the named phases to word boundaries of the data transmitted;

generating a first plurality of local phases, including center-data phases and edge-data phases that correspond to data-bit centers and data-bit edges for each of a second plurality of bits transmitted per major channel clock period;

dynamically adjusting a delay applied to the first plurality of local phases to establish a second plurality of local center-data phases in a center of the second plurality of bits received by a corresponding receiver; and serializing and de-serializing the channel data for the receiver using the center-data phases.

2. A method of operating receive circuitry coupled to a parallel channel comprising parallel data lines and a parallel clock line, wherein the parallel data lines transfer calibration signals and data signals, wherein the parallel clock line transfers clock signals, wherein the receive circuitry comprises a plurality of receivers that are each coupled to one of the parallel data lines, the method comprising:

processing the clock signals to generate a plurality of master phases;

referencing the master phases to word boundaries in the data signals;

in each of the receivers, processing the master phases to generate local phases;

in each of the receivers, processing the calibration signals to adjust the local phases; and in each of the receivers, de-serializing the data signals using the adjusted local phases.

3. The method of claim 2 wherein processing the clock signal to generate the plurality of master phases comprises using a single delay locked loop for all of the receivers on the parallel channel.

4. The method of claim 2 wherein referencing the master phases to the word boundaries in the data signals comprises referencing the master phases to the word boundaries on the slowest of the parallel data lines.

5. The method of claim 2 wherein processing the calibration signals to adjust the local phases comprises processing the calibration signals to adjust the local phases to local center-data phases.

6. The method of claim 2 wherein the master phases include an edge phase and a center phase for each bit in the calibration signals.

7. The method of claim 2 wherein the calibration signals are processed to adjust the local phases every clock period.

8. The method of claim 2 wherein the calibration signals comprise the pattern "10100111".

9. Receive circuitry coupled to a parallel channel comprising parallel data lines and a parallel clock line, wherein the parallel data lines transfer calibration signals and data signals, and wherein the parallel clock line transfers clock signals, the receive circuitry comprising:

clock circuitry configured to process the clock signals to generate a plurality of master phases and to reference the master phases to word boundaries in the data signals; and a plurality of receivers that are each coupled to one of the parallel data lines wherein each of the receivers is configured to process the master phases to generate local phases, process the calibration signals to adjust the local phases, and de-serialize the data signals using the adjusted local phases.

10. The receive circuitry of claim 9 wherein the clock circuitry comprises a single delay locked loop for all of the receivers on the parallel channel and the delay locked loop is configured to generate the plurality of master phases.

11. The receive circuitry of claim 9 wherein the clock circuitry is configured to reference the master phases to the word boundaries on the slowest of the parallel data lines.

12. The receive circuitry of claim 9 wherein the receivers are each configured to process the calibration signals to adjust the local phases to local center-data phases.

13. The receive circuitry of claim 9 wherein the master phases include an edge phase and a center phase for each bit in the calibration signals.

14. The receive circuitry of claim 9 wherein the receivers are each configured to process the calibration signals to adjust the local phases every clock period.

15. The receive circuitry of claim 9 wherein the calibration signals comprise the pattern "10100111".

* * * * *